US012668668B2

(12) United States Patent
Bark et al.

(10) Patent No.: US 12,668,668 B2
(45) Date of Patent: Jun. 30, 2026

(54) FLEXIBLE EFFECTIVE HEAT TRANSPORT COMPOSITES FOR THERMAL INTERFACE APPLICATIONS

(71) Applicant: Nanyang Technological University, Singapore (SG)

(72) Inventors: Hyunwoo Bark, Singapore (SG); Pooi See Lee, Singapore (SG)

(73) Assignee: Nanyang Technological University, Singapore (SG)

( * ) Notice: Subject to any disclaimer, the term of this patent is extended or adjusted under 35 U.S.C. 154(b) by 141 days.

(21) Appl. No.: 18/548,625

(22) PCT Filed: Apr. 29, 2022

(86) PCT No.: PCT/SG2022/050265

§ 371 (c)(1),
(2) Date: Sep. 1, 2023

(87) PCT Pub. No.: WO2022/235211

PCT Pub. Date: Nov. 10, 2022

(65) Prior Publication Data

US 2024/0174816 A1 May 30, 2024

(30) Foreign Application Priority Data

May 3, 2021 (SG) ........................... 10202104540U

(51) Int. Cl.
*H10N 10/13* (2023.01)
*C08G 77/12* (2006.01)
(Continued)

(52) U.S. Cl.
CPC ............. *C08G 77/26* (2013.01); *C08G 77/12* (2013.01); *C08G 77/14* (2013.01); *C08G 77/38* (2013.01);
(Continued)

(58) Field of Classification Search
None
See application file for complete search history.

(56) References Cited

U.S. PATENT DOCUMENTS

2017/0218167 A1 8/2017 Majidi et al.
2023/0041077 A1* 2/2023 Won ..................... H10N 10/817

FOREIGN PATENT DOCUMENTS

CN 112280284 A 1/2021

OTHER PUBLICATIONS

Farrel, Z. J. et al., Silanized Liquid-Metal Nanoparticles for Responsive Electronics. ACS Appl. Nano Mater., May 28, 2020, vol. 3, pp. 6297-6303 [Retrieved on Aug. 8, 2022] <DOI: 10.1021/ACSANM. OC01056> see section-introduction; and Figure 1.

(Continued)

*Primary Examiner* — Dustin Q Dam
(74) *Attorney, Agent, or Firm* — Patterson + Sheridan, LLP

(57) ABSTRACT

Disclosed herein is a composite material comprising a crosslinked polymeric matrix, the crosslinked polymeric matrix formed from a polymeric material comprising a plurality of carboxylic acid functional groups and a plurality of liquid metal particles having a surface functionalized with a plurality of amino and/or hydroxyl functional groups, where the plurality of liquid metal particles and the polymeric material are covalently bonded together by a plurality of amide and/or ester bonds formed from the plurality of carboxylic acid functional groups and the plurality of amino and/or hydroxyl functional groups. Also disclosed herein is a thermal interface layer using said composite material and a thermoelectric device also using said composite material.

20 Claims, 7 Drawing Sheets

(51) Int. Cl.
*C08G 77/14* (2006.01)
*C08G 77/26* (2006.01)
*C08G 77/38* (2006.01)
*C08K 9/08* (2006.01)
*C09K 5/06* (2006.01)
*H10N 10/852* (2023.01)

(52) U.S. Cl.
CPC ................ *C08K 9/08* (2013.01); *C09K 5/063* (2013.01); *H10N 10/13* (2023.02); *C08K 2201/001* (2013.01); *C08K 2201/005* (2013.01); *C08K 2201/011* (2013.01); *H10N 10/852* (2023.02)

(56) References Cited

OTHER PUBLICATIONS

Liao, M. et al., Polyvinyl Alcohol-Stabilized Liquid Metal Hydrogel for Wearable Transient Ep. ACS Appl. Mater. Intetfaces, Nov. 22, 2019, vol. 11, pp. 47358-47364 [Retrieved on Aug. 8, 2022] <DOI: 10.1021/ACSAMI.9B16675> abstract and figures.

Chechetka, S. A. et al., Light-driven liquid metal nanotransformers for biomedical theranostics. Nature Communications, May 31, 2017, vol. 8, pp. 15432 (1-19) [Retrieved on Aug. 8, 2022] <DOI: 10.1038/NCOMMS15432> abstract and figures.

Bark, H. et al., Surface modification of liquid metal as an effective approach for deformable electronics and energy devices. Chemical Science, Feb. 2, 2021, vol. 12, pp. 2760-2777 [Retrieved on Aug. 8, 2022] <DOI: 10.1039/DOSC0531 OD> section 3-Surface modification of the liquid metal particle.

Bark, H. et al., Deformable High Loading Liquid Metal Nanoparticles Composites for Thermal Energy Management. Adv. Energy Mater., Jul. 14, 2021, vol. 11, No. 35, pp. 2101387 (1-11) [Retrieved on Aug. 8, 2022] <DOI: 10.1002/AENM.202101387> abstract and Figures.

International Search Report and Written Opinion in related application PCT/SG2022/050265 dated Aug. 12, 2022.

Ekpu, et al.; "Advanced thermal management materials for heat sinks used in microelectronics", presented at 18th European Microelectronics & Packaging Conference, Sep. 12-15, 2011, 2011.

Hong et al.; An Adaptive and Wearable Thermal Camouflage Device, Advanced Functional Materials 2020, 30, 1909788.

Bhanushali, et al.; Copper Nanowire-Filled Soft Elastomer Composites for Applications as Thermal Interface Materials; Advanced Materials Interfaces 2017, 4, 1700387.

Fu et al.;, Effects of particle size, particle/matrix interface adhesion and particle loading on mechanical properties of particulate-polymer composites; Composites Part B: Engineering 2008, 39, 933.

Yu et al.; Electrical, thermal, and species transport properties of liquid eutectic Ga—In and Ga—In—Sn from first principles; The Journal of Chemical Physics 2014, 140, 064303.

Bartlett, et al., High thermal conductivity in soft elastomers with elongated liquid metal inclusions; Proceedings of the National Academy of Sciences 2017, 114, 2143.

Markvicka, et al.; an autonomously electrically self-healing liquid metal-elastomer composite for robust soft-matter robotics and electronics; Nature Materials 2018, 17, 618.

Tutika, et al.; Liquid Metal-Elastomer Soft Composites with Independently Controllable and Highly Tunable Droplet Size and Volume Loading; ACS Applied Materials & Interfaces 2019, 11, 17873.

Lee, et al.; Stretchable Skin-Like Cooling/Heating Device for Reconstruction of Artificial Thermal Sensation in Virtual Reality, Advanced Functional Materials 2020, 30, 1909171.

Hong, et al.; Wearable thermoelectrics for personalized Thermoregulation; R. Chen, Science Advances 2019, 5, eaaw0536.

Zadan, et al.; Soft and Stretchable Thermoelectric Generators Enabled by Liquid Metal Elastomer Composites; ACS Applied Materials & Interfaces 2020, 12, 17921.

Liu et al.; Effectiveness of the Young-Laplace equation at nanoscale; Scientific Reports 2016, 6, 23936.

* cited by examiner

FLEXIBLE EFFECTIVE HEAT TRANSPORT COMPOSITES FOR THERMAL INTERFACE APPLICATIONS

FIELD OF INVENTION

The current invention relates to a composite material that is flexible and conduct heat, as well as its uses in various thermal interface applications.

BACKGROUND

The listing or discussion of a prior-published document in this specification should not necessarily be taken as an acknowledgement that the document is part of the state of the art or is common general knowledge.

The development of highly integrated circuit technology, downsizing, light-weight, and high-performance electronic devices has critical importance to society progression. However, these electronic devices entail heat generation issues, which cause the deterioration of the device performance and thermal runaways with safety concerns. Thus, heat dissipation is a significantly important factor to protect the device safety and operation life. Since a metal such as Cu and Al, has a high thermal conductivity (~$10^2$ W/mK, M. Ekpu et al., *18th European Microelectronics & Packaging Conference* 2011, 1-8), metal has been widely utilized for heat dissipation. However, with the surge of various form factor devices, the demand for a deformable heat dissipation material is increasing.

To obtain a deformable and thermally conductive material, the polymer and metal filler composite has been employed due to its good mouldability into various shapes. Generally, inorganic metal fillers such as metal nanoparticles, 2D flakes, and nanowires, are dispersed in a polymer matrix (S. Hong, S. Shin & R. Chen, *Adv. Funct. Mater.* 2020, 30, 1909788; and S. Bhanushali et al., *Adv. Mater. Interfaces* 2017, 4, 1700387). Since the percolation between inorganic fillers in the polymer matrix provides the thermally conductive path, the ratio between inorganic fillers and polymer matrix determines the thermal conductivity. Even though a higher ratio of inorganic fillers provides higher thermal conductivity, the brittleness and poor flexibility of the composite associated with increasing inorganic filler contents are obstacles for utilization (S.-Y. Fu et al., *Compos. B. Eng.* 2008, 39, 933). Moreover, the higher metal filler ratio causes electrical conductivity in the composite, which is undesirable for insulative or electrical isolation applications.

Liquid metal is attractive as the filler in the composite due to its infinite deformability and high thermal conductivity (EGaln: ~26 W/mK, S. Yu & M. Kaviany, *J. Chem. Phys.* 2014, 140, 064303). In the case of liquid metal/polymer composite, the high-volume loading (>20 vol %) of liquid metal with ~$10^1$ μm size can be fabricated, and the soft composite can be obtained. However, when the composite suffers mechanical stress, the ~$10^1$ μm size of liquid metal particles can be readily deformed. For example, when the composite suffers mechanical stress, the spherical shape of liquid metal particles is converted into a high aspect ratio such as needle shape, with aligning the perpendicular direction of compression (M. D. Bartlett et al., *Proc. Natl. Acad. Sci. U.S.A.* 2017, 114, 2143). In this stage, when the thermal stimuli are applied at the compression side, the thermal transport with parallel direction to compression is inhibited due to the anisotropic deformation of liquid metal. Moreover, the coalescence of the liquid metal particles occurs under external mechanical force and leads to electrical transport path (E. J. Markvicka et al., *Nat. Mater.* 2018, 17, 618). This electrical conduction by the mechanical force can cause unintended electrical current path in electronic device, resulting in failure. In addition, the dispersion of high-volume loading (>20 vol %) of colloidal liquid metal particles in the polymer matrix is challenging due to the wettability issue of the colloidal liquid metal particles in the polymer matrix (R. Tutika et al., *ACS Appl. Mater. Interfaces* 2019, 11, 17873). One of the practical applications of thermally conductive composites is thermal interface layer of a wearable thermoelectric device. Recently, thermal interface layer with Ag flake/PDMS, aluminum nitride (AlN)/PDMS, or ~$10^1$ μm size of EGaln/PDMS composite has been applied in thermoelectric devices (J. Lee et al., *Adv. Funct. Mater* 2020, 30, 1909171; S. Hong et al., *Sci. Adv.* 2019, 5, eaaw0536; and M. Zadan, M. H. Malakooti & C. Majidi, *ACS Appl. Mater. Interfaces* 2020, 12, 17921). However, these reports focused on the improvement of thermal conductivity. Especially in the case of ~$10^1$ μm size of EGaln/PDMS composite, the possibility of providing unintended electrically conductive path by mechanical force still persists.

Therefore, there exists a need to discover new and flexible composites with effective heat transport for thermal interface applications.

SUMMARY OF INVENTION

Aspects and embodiments of the invention will now be discussed by reference to the following numbered clauses.

1. A composite material comprising a crosslinked polymeric matrix, the crosslinked polymeric matrix comprising:
   - a polymeric material comprising a plurality of carboxylic acid functional groups; and
   - a plurality of liquid metal particles having a surface functionalized with a plurality of amino and/or hydroxyl functional groups, wherein
   - the plurality of liquid metal particles and the polymeric material are covalently bonded together by a plurality of amide and/or ester bonds formed from the plurality of carboxylic acid functional groups and the plurality of amino and/or hydroxyl functional groups.

2. The composite material according to Clause 1, wherein the polymeric material is a polyalkylcarboxylic acid siloxane.

3. The composite material according to Clause 2, wherein the polyalkylcarboxylic acid siloxane has a repeating unit according to formula I:

I

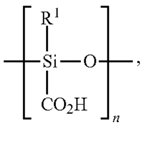

Where $R^1$ is a $C_1$ to $C_6$ alkyl group that is unbranched or branched, optionally wherein $R^1$ is methyl.

4. The composite material according to any one of the preceding clauses, wherein the polymeric material has a number average molecular weight of from 700 to 5000 g/mol, such as from 4,000 to 5,000 g/mol, or from 1,000 to 2,000 g/mol, such as from 1,400 to 1,800 g/mol.

5. The composite material according to any one of the preceding clauses, wherein the plurality of liquid metal particles have a surface functionalized by a block copolymer moiety formed from formula II and/or formula III:

II

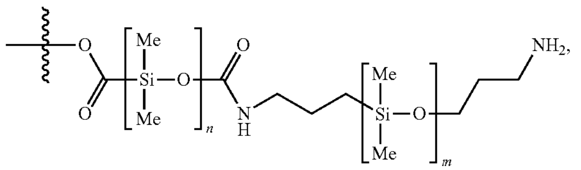

III

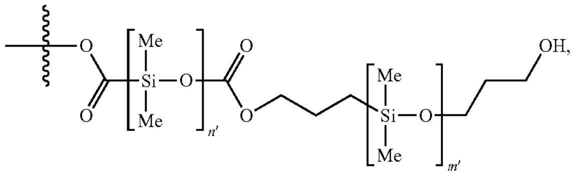

where n, n', m and m' refer to the repeating units of the block copolymer moiety; and the wavy line refers to the point of attachment to the surface of the liquid metal particles to which the block copolymer moiety is attached, optionally wherein the plurality of liquid metal particles have a surface functionalized by a block copolymer moiety formed from formula II.

6. The composite material according to Clause 5, wherein the number average molecular weight of the block copolymer moiety is from 5,000 to 20,000, such as from 7,500 to 15,000 g/mol, such as about 9,500 g/mol.

7. The composite material according to any one of the preceding clauses, wherein the plurality of liquid metal particles having a surface functionalized with a plurality of amino and/or hydroxyl functional groups have an average particle size of from 50 nm to 50 μm, such as from 100 to 500 nm, such as from 150 to 400 nm, such as from 200 to 300 nm, such as about 260 nm, such as from greater than 0.5 to 25 μm, such as from 0.75 to 10 μm, such as about 1 μm.

8. The composite material according to any one of the preceding clauses, wherein the liquid metal in the plurality of liquid metal particles having a surface functionalized with a plurality of amino functional groups is selected from one or more of the group consisting of EGaln, EGalnSn, EGalnSnZn, ECsln, ECslnSn, ECslnZn, optionally wherein the liquid metal in the plurality of liquid metal particles having a surface functionalized with a plurality of amino functional groups is EGaln.

9. The composite material according to any one of the preceding clauses, wherein the plurality of liquid metal particles form from greater than 20 to 50 vol % of the composite material's volume, optionally wherein the plurality of liquid metal particles form about 44 vol % of the composite material's volume.

10. The composite material according to any one of the preceding clauses, wherein the plurality of liquid metal particles are provided having a close packed arrangement within the composite material.

11. The composite material according to any one of the preceding clauses, wherein the composite material has a thermal conductivity of from 1.0 to 1.5 κ(W/mK), such as from 1.1 to 1.25 κ(W/mK) when under no strain.

12. The composite material according to any one of the preceding clauses, wherein, when:

(i) the plurality of liquid metal particles having a surface functionalized with a plurality of amino and/or hydroxyl functional groups have an average particle size of from 50 nm to 1 μm, such as from 100 to 500 nm, such as from 150 to 400 nm, such as from 200 to 300 nm, such as about 260 nm; and (ii) the composite material is formed as a cuboidal film with a length and a width, where the width is smaller in dimension than the length, the composite material has:

(ai) a thermal conductivity under a strain perpendicular to the length of the cuboidal film that is greater than a thermal conductivity of the same cuboidal film when under no strain, optionally wherein the thermal conductivity under no strain is from 1.1 to 1.25 κ(W/mK) and the thermal conductivity under 100% strain perpendicular to the length of the cuboidal film is from 2 to 3 (e.g. about 2.5) κ(W/mK); and/or (aii) a thermal conductivity under a strain parallel to the length of the cuboidal film that is less than or equal to a thermal conductivity of the same cuboidal film when under no strain, optionally wherein the thermal conductivity under no strain is from 1.1 to 1.25 κ(W/mK) and the thermal conductivity under 100% strain parallel to the length of the cuboidal film is about 1.

13. The composite material according to any one of Clauses 1 to 11, wherein, when:

(ia) the plurality of liquid metal particles having a surface functionalized with a plurality of amino and/or hydroxyl functional groups have an average particle size of from greater than 1 to 50 μm, such as from 1.5 to 20 μm, such as about 2 μm; and (iia) the composite material is formed as a cuboidal film with a length and a width, where the width is smaller in dimension than the length, the composite material has:

(bi) a thermal conductivity under a strain parallel to the length of the cuboidal film that is greater than a thermal conductivity of the same cuboidal film when under no strain, optionally wherein the thermal conductivity under no strain is from 1.1 to 1.25 κ(W/mK) and the thermal conductivity under 100% strain parallel to the length of the cuboidal film is from 2 to 3 (e.g. about 2.5) κ(W/mK); and/or (bii) a thermal conductivity under a strain perpendicular to the length of the cuboidal film that is less than or equal to a thermal conductivity of the same cuboidal film when under no strain, optionally wherein the thermal conductivity under no strain is from 1.1 to 1.25 κ(W/mK) and the thermal conductivity under 100% strain perpendicular to the length of the cuboidal film is about 1 κ(W/mK).

14. The composite material according to any one of the preceding clauses, wherein the plurality of liquid metal particles having a surface functionalized with a plurality of amino and/or hydroxyl functional groups have a surface functionalized with a plurality of amino functional groups.

15. A thermal interface layer comprising a composite material according to any one of Clauses 1 to 14 and n- and p-type thermoelectric legs, optionally wherein the n- and p-type thermoelectric legs are $Bi_2Te_3$, optionally wherein the thermal interface layer is a wearable thermal interface layer.

16. A deformable thermoelectric device comprising a composite material according to any one of Clauses 1 to 14.

17. The deformable thermoelectric device according to Clause 14, where the thermoelectric device comprises a thermal interface layer comprising a composite material according to any one of Clauses 1 to 14 and n- and p-type thermoelectric legs, optionally wherein the n- and p-type thermoelectric legs are $Bi_2Te_3$.

18. The deformable thermoelectric device according to Clause 16 or Clause 17, wherein when the deformable thermoelectric device has a first surface and a second surface and the plurality of liquid metal particles having a surface functionalized with a plurality of amino and/or hydroxyl functional groups have an average particle size of from 50 nm to 10 μm, such as from 100 to 500 nm, such as from 150 to 400 nm, such as from 200 to 300 nm, such as about 260 nm, then when a difference in temperature exists between the first surface and the second surface of the deformable thermoelectric device, then a normalized open circuit voltage of the thermoelectric device will increase with an increase in pressure, optionally wherein the difference in temperature is at least 4.7 K (e.g. from 4.7 to 12.7 K).

19. The deformable thermoelectric device according to any one of Clauses 16 to 18, wherein the deformable thermoelectric device is a wearable deformable thermoelectric device.

20. The deformable thermoelectric device according to any one of Clauses 16 to 18, wherein the deformable thermoelectric device forms part of one or more of a power device in an antenna, and a deformable device that requires power (e.g. a foldable mobile phone).

DRAWINGS

Figure 8:
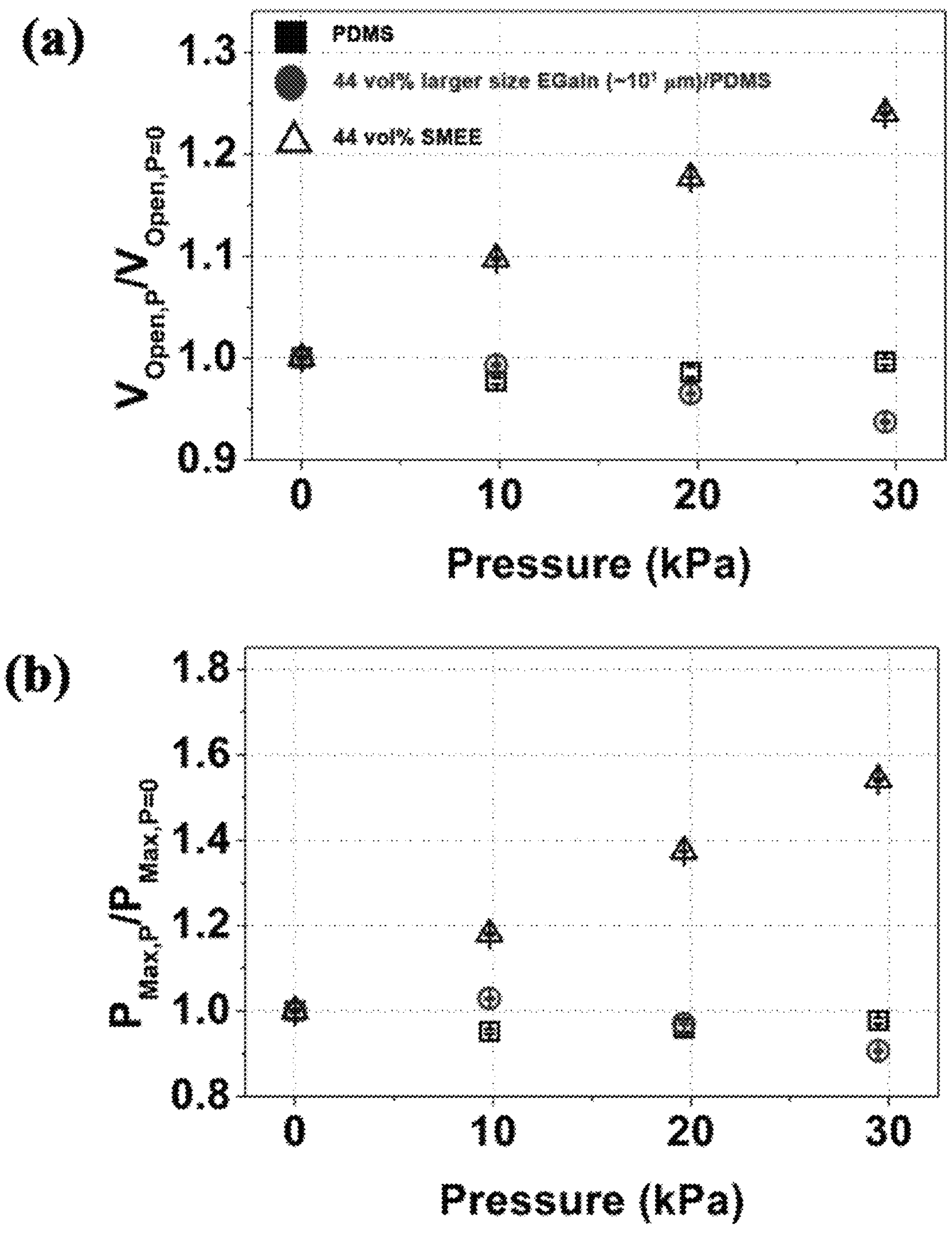

FIG. 8 depicts (a) pressure dependent normalized $V_{Open}$ of the thermoelectric device with PDMS (square), 44 vol % larger size EGaln ($\sim10^1$ μm)/PDMS (circle), and 44 vol % SMEE (triangle) thermal interface at $\Delta T$=4.7 K; and (b) pressure dependent normalized $P_{Max}$ of the thermoelectric device with PDMS (square), 44 vol % larger size EGaln ($\sim10^1$ μm)/PDMS (circle), and 44 vol % SMEE (triangle) thermal interface at $\Delta T$=4.7 K.

DESCRIPTION

It has been surprisingly found that some or all of the problems identified above can be solved by the use of a composite material formed from a crosslinked polymeric matrix that incorporates liquid metal particles. Thus, in a first aspect of the invention, there is provided a composite material comprising a crosslinked polymeric matrix, the crosslinked polymeric matrix comprising:

a polymeric material comprising a plurality of carboxylic acid functional groups; and a plurality of liquid metal particles having a surface functionalized with a plurality of amino and/or hydroxyl functional groups, wherein the plurality of liquid metal particles and the polymeric material are covalently bonded together by a plurality of amide and/or ester bonds formed from the plurality of carboxylic acid functional groups and the plurality of amino and/or hydroxyl functional groups.

In embodiments herein, the word "comprising" may be interpreted as requiring the features mentioned, but not limiting the presence of other features. Alternatively, the word "comprising" may also relate to the situation where only the components/features listed are intended to be present (e.g. the word "comprising" may be replaced by the phrases "consists of" or "consists essentially of"). It is explicitly contemplated that both the broader and narrower interpretations can be applied to all aspects and embodiments of the present invention. In other words, the word "comprising" and synonyms thereof may be replaced by the phrase "consisting of" or the phrase "consists essentially of" or synonyms thereof and vice versa.

The phrase, "consists essentially of" and its pseudonyms may be interpreted herein to refer to a material where minor impurities may be present. For example, the material may be greater than or equal to 90% pure, such as greater than 95% pure, such as greater than 97% pure, such as greater than 99% pure, such as greater than 99.9% pure, such as greater than 99.99% pure, such as greater than 99.999% pure, such as 100% pure.

As used herein, the singular forms "a," "an," and "the" include plural referents unless the context clearly dictates otherwise.

The crosslinked polymeric matrix described herein is formed by the reaction of the polymeric material comprising a plurality of carboxylic acid functional groups and the plurality of liquid metal particles having a surface functionalized with a plurality of amino and/or hydroxyl functional groups. As will be appreciated, the crosslinked polymeric material either has amide or ester bonds forming the connections between the polymeric material and the liquid metal particles. It will also be appreciated that the term "carboxylic acid functional group" is used herein as a way of illustrating the functionality present in the polymeric material. As such, the actual functional group used in the reaction to form the amide/ester bond may be any suitable variation on this theme (e.g. carboxylate anionic groups, esters etc.).

The term "liquid metal particle" when used herein refers to an alloy of more than one metal that is liquid at (or slightly above) room temperature. Any suitable liquid metal may be used herein. For example, the liquid metals used herein may be a eutectic alloy of a number of metals. For example, the eutectic alloy may be, but not limited to, EGaln, EGalnSn, EGalnSnZn, ECsln, ECslnSn, ECslnZn, and combinations thereof. For the avoidance of doubt, "E" in each of these alloys, is used as an abbreviator for eutectic.

Any suitable polymeric material that has a carboxylic acid functionality (or a suitable functional equivalent) can be used herein. For example, the polymeric material may be a polyalkylcarboxylic acid siloxane. Any suitable polyalkylcarboxylic acid siloxane may be used. In particular examples that may be mentioned herein, the polyalkylcarboxylic acid siloxane may have a repeating unit according to formula I:

I

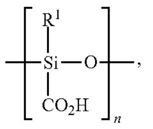

where $R^1$ is a $C_1$ to $C_6$ alkyl group that is unbranched or branched. For example, $R^1$ may be methyl.

The polymeric material may have any suitable molecular weight. Examples of suitable molecular weights include, but are not limited to a number average molecular weight of from 700 to 5000 g/mol, such as from 4,000 to 5,000 g/mol, or from 1,000 to 2,000 g/mol, such as from 1,400 to 1,800 g/mol.

For the avoidance of doubt, it is explicitly contemplated that where a number of numerical ranges related to the same feature are cited herein, that the end points for each range are intended to be combined in any order to provide further contemplated (and implicitly disclosed) ranges. Thus, the following number average molecular weight ranges are specifically contemplated herein:

from 700 to 1,000 g/mol, from 700 to 1,400 g/mol, from 700 to 1,800 g/mol, from 700 to 2,000 g/mol, from 700 to 4,000 g/mol, from 700 to 5,000 g/mol;

from 1,000 to 1,400 g/mol, from 1,000 to 1,800 g/mol, from 1,000 to 2,000 g/mol, from 1,000 to 4,000 g/mol, from 1,000 to 5,000 g/mol;

from 1,400 to 1,800 g/mol, from 1,400 to 2,000 g/mol, from 1,400 to 4,000 g/mol, from 1,400 to 5,000 g/mol;

from 1,800 to 2,000 g/mol, from 1,800 to 4,000 g/mol, from 1,800 to 5,000 g/mol;

from 2,000 to 4,000 g/mol, from 2,000 to 5,000 g/mol; and from 4,000 to 5,000 g/mol.

As mentioned hereinbefore, the plurality of liquid metal particles have a surface functionalized by a block copolymer moiety. As noted, this functionalization should provide a hydroxyl or amino group, so that the desired amide can be formed at the points of attachment of the liquid metal particles to the polymeric material.

Any suitable moiety that can attached itself to the liquid metal particles and has an amino or hydroxyl may be used herein. For example, the plurality of liquid metal particles may have a surface functionalized by a block copolymer moiety formed from formula II and/or formula III:

II

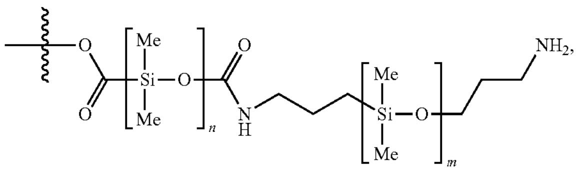

-continued

III

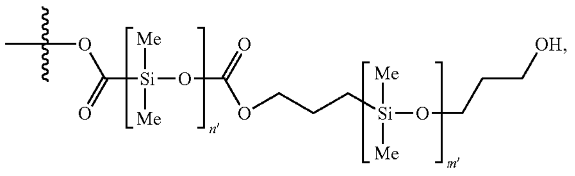

where n, n', m and m' refer to the repeating units of the block copolymer moiety; and the wavy line refers to the point of attachment to the surface of the liquid metal particles to which the block copolymer moiety is attached. In particular embodiments of the invention that may be mentioned herein, the plurality of liquid metal particles may have a surface functionalized by a block copolymer moiety formed from formula II.

In order to manufacture the moieties of formula II and III, the liquid metal particles are first reacted with a block copolymer, where each end of the block copolymer is terminated by a carboxylic acid group. The resulting product is then reacted with a further block copolymer, where each end is terminated with two hydroxyl groups or two amino groups. It will be appreciated, that a mixture of these two groups is contemplated, as is the situation where the further block copolymer is formed with one end terminated by an amino group, while the other end is terminated with a hydroxyl group.

The molecular weight of the block copolymer moiety (i.e. the block copolymer moiety of formula II or formula III) may have a number average molecular weight of from 5,000 to 20,000, such as from 7,500 to 15,000 g/mol, such as about 9,500 g/mol.

The liquid metal particles used herein may have any suitable particle size. For example, the plurality of liquid metal particles having a surface functionalized with a plurality of amino and/or hydroxyl functional groups may have an average particle size of from 50 nm to 50 μm, such as from 100 to 500 nm, such as from 150 to 400 nm, such as from 200 to 300 nm, such as about 260 nm, such as from greater than 0.5 to 25 μm, such as from 0.75 to 10 μm, such as about 1 μm.

In particular embodiments of the invention that may be mentioned herein, the liquid metal in the plurality of liquid metal particles having a surface functionalized with a plurality of amino functional groups may be selected from one or more of the group consisting of EGaIn, EGaInSn, EGaInSnZn, ECsIn, ECsInSn, ECsInZn. In yet more particular embodiments of the invention disclosed herein, the liquid metal in the plurality of liquid metal particles having a surface functionalized with a plurality of amino functional groups may be EGaIn.

The plurality of liquid metal particles may occupy any possible volume of the composite material's volume. For example, the plurality of liquid metal particles may form from greater than 20 to 50 vol % of the composite material's volume. Yet more particularly, the plurality of liquid metal particles may form about 44 vol % of the composite material's volume.

The plurality of liquid metal particles may have any suitable packing arrangement within the composite material. In particular embodiments of the invention, the plurality of liquid metal particles may have a close packed arrangement within the composite material.

As noted above, the composite material has anisotropic thermal conductivity properties when placed under a strain. However, it also has thermal conductive properties when under no strain.

For example, the composite material may have a thermal conductivity of from 1.0 to 1.5 κ(W/mK), such as from 1.1 to 1.25 κ(W/mK) when under no strain.

It has been surprisingly found that the properties of the composite material may change depending on the size of the liquid metal particles used within the composite material. This will be discussed in more detail below.

When the liquid metal particles having a surface functionalized with a plurality of amino and/or hydroxyl functional groups have an average particle size of from 50 nm to 1 μm (such as from 100 to 500 nm, such as from 150 to 400 nm, such as from 200 to 300 nm, such as about 260 nm) and the composite material is formed as a cuboidal film with a length and a width, where the width is smaller in dimension than the length, then composite material has:

(ai) a thermal conductivity under a strain perpendicular to the length of the cuboidal film that is greater than a thermal conductivity of the same cuboidal film when under no strain; and/or (aii) a thermal conductivity under a strain parallel to the length of the cuboidal film that is less than or equal to a thermal conductivity of the same cuboidal film when under no strain.

More specifically, the above composite material may display a:

thermal conductivity under no strain is from 1.1 to 1.25 κ(W/mK) and the thermal conductivity under 100% strain perpendicular to the length of the cuboidal film is from 2 to 3 (e.g. about 2.5) κ(W/mK); and/or thermal conductivity under no strain is from 1.1 to 1.25 κ(W/mK) and the thermal conductivity under 100% strain parallel to the length of the cuboidal film is about 1.

When the liquid metal particles having a surface functionalized with a plurality of amino and/or hydroxyl functional groups have an average particle size of from greater than 1 to 50 μm (such as from 1.5 to 20 μm, such as about 2 μm) and the composite material is formed as a cuboidal film with a length and a width, where the width is smaller in dimension than the length, then composite material has:

(bi) a thermal conductivity under a strain parallel to the length of the cuboidal film that is greater than a thermal conductivity of the same cuboidal film when under no strain; and/or (bii) a thermal conductivity under a strain perpendicular to the length of the cuboidal film that is less than or equal to a thermal conductivity of the same cuboidal film when under no strain.

More specifically, the above composite material may display a:

thermal conductivity under no strain is from 1.1 to 1.25 κ(W/mK) and the thermal conductivity under 100% strain parallel to the length of the cuboidal film is from 2 to 3 (e.g. about 2.5) κ(W/mK); and/or thermal conductivity under no strain is from 1.1 to 1.25 κ(W/mK) and the thermal conductivity under 100% strain perpendicular to the length of the cuboidal film is about 1 κ(W/mK).

In embodiments of the invention that may be mentioned herein, the plurality of liquid metal particles having a surface functionalized with a plurality of amino and/or hydroxyl functional groups may have a surface functionalized with a plurality of amino functional groups. As will be appreciated, in the composite material, these amino functional groups will form part of an amide bond, forming a point of attachment of a liquid metal particle to the polymeric material, as described herein.

As noted hereinbefore, the composite material may be useful as part of a thermal interface layer. Thus in a second aspect of the invention, there is disclosed a thermal interface layer comprising a composite material as described hereinbefore and n- and p-type thermoelectric legs. As will be appreciated any suitable number of n- and p-type thermoelectric legs may be fitted to the composite material, provided that it allows the resulting product to act as a thermal interface layer in a device. In embodiments of the invention the n- and p-type thermoelectric legs may be $Bi_2Te_3$. In certain embodiments that may be mentioned herein, the thermal interface layer is a wearable thermal interface layer.

As noted hereinbefore, the composite material disclosed herein is deformable and can display anisotropic thermal conductivity. As such, it is suited for use in the formation of deformable thermoelectric devices. Thus, in a third aspect of the invention, there is provided a deformable thermoelectric device comprising a composite material as described hereinbefore.

The thermoelectric device may be any possible thermoelectric device that benefits from the inclusion of the thermal interface layer of the kind discussed in the second aspect of the invention and its embodiments (and so discussion of those points will not be repeated here for the sake of brevity).

In certain embodiments, when the deformable thermoelectric device has a first surface and a second surface and the plurality of liquid metal particles having a surface functionalized with a plurality of amino and/or hydroxyl functional groups have an average particle size of from 50 nm to 10 μm, such as from 100 to 500 nm, such as from 150 to 400 nm, such as from 200 to 300 nm, such as about 260 nm, then when a difference in temperature exists between the first surface and the second surface of the deformable thermoelectric device, then a normalized open circuit voltage of the thermoelectric device will increase with an increase in pressure. For example, the difference in temperature may be at least 4.7 K (e.g. from 4.7 to 12.7 K).

The deformable thermoelectric device may, in certain embodiments be a wearable deformable thermoelectric device.

In certain embodiments, the deformable thermoelectric device may form part of one or more of a power device in an antenna, and a deformable device that requires power (e.g. a foldable mobile phone).

Further aspects and embodiments of the invention will now be discussed by reference to the following non-limiting examples.

Examples

Materials

Acrylic acid (99%, MW 72.06 g/mol) were purchased from Sigma-Aldrich. Hydride-terminated PDMS (DMS-H21, MW ~4500 g/mL), aminopropyl-terminated PDMS ($NH_2$-PDMS-$NH_2$, DMS-A21, MW ~5000 g/mol), and polymethylhydrosiloxane (PMHS, HMS-991, MW 1400-1800 g/mol) were purchased from Gelest. Eutectic gallium indium (EGaIn) was purchased from Smart Memories (Singapore). Sylgard 184 and Ecoflex00-30, which are commercial PDMS, were purchased from Dow corning and Smooth- On, Inc., respectively. Ag paste was purchased from TED PELLA, Inc. Pt catalyst (Platinum(0)-1,3-divinyl-1,1,3,3-tetramethyldisiloxane complex solution) and sodium sulfate (ACS reagent 99.0%, anhydrous, powder) were purchased from Sigma-Aldrich.

Analytical Techniques

Dynamic Light Scattering (DLS)

The particle size was characterized by nanoparticle Zeta potential analyzer (SZ-100, Horiba).

SEM

The cross-sectional image was characterized by FESEM (JSM-7600F, JEOL).

Example 1. Preparation of PM(COOH)S and Larger Size EGaln Elastomer

Synthesis of PM(COOH)S

Generally, 1 g of PMHS was dissolved in 40 ml of toluene, and degassed by Ar for 10 min. Then, 1.756 g of acrylic acid was added slowly, followed by adding 0.2 wt % of Pt catalyst. The mixture was kept at 353 K (80° C.) for 24 hours. After reaction, the product was washed by $H_2O$, and dried over by $Na_2SO_4$.

Synthesis of Larger Size EGaln Elastomer

To fabricate the control sample (shear-mixed EGaln/COOH-PDMS-CONH-PDMS-$NH_2$), 0.5 g of COOH-PDMS-COOH, 0.5 g of $NH_2$-PDMS-$NH_2$, and 1.35 g of PM(COOH)S solution was mixed and stirred for 10 min. Then, the reaction mixture and 5 g of EGaln was shear-mixed by the mortar and pestle for 10 min. The ground result was casted in the customized mold and degassed for 30 min, followed by curing at 413 K for 24 hours.

Synthesis of Pure PDMS (COOH-PDMS-COOH/$NH_2$-PDMS-$NH_2$/PM(COOH)S)

Pure PDMS was prepared from COOH-PDMS-COOH, $NH_2$-PDMS-$NH_2$ and PM(COOH)S by following the protocol for larger size EGaln elastomer except no EGaln was added.

Example 2. Preparation of SMEE

Figure 1:
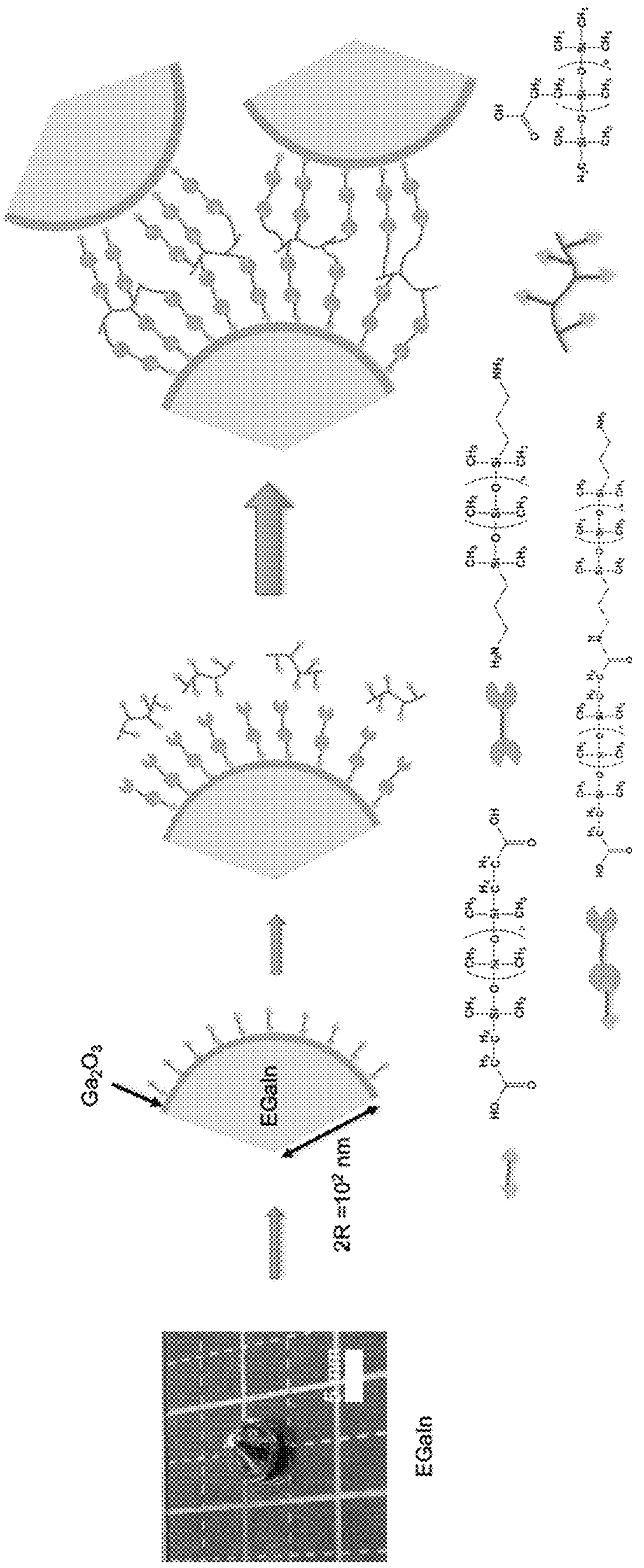
FIG. 1 depicts the schematic illustration of the preparation of surface-modified EGaln particle elastomer (SMEE).

The fabrication of SMEE via high-volume loading of colloidal EGaln particles (~44 vol %) in elastomer matrix through surface modification on the EGaln particles is as illustrated in FIG. 1.

Firstly, the carboxylic acid-terminated PDMS (COOH-PDMS-COOH) was employed for the surface modification of the liquid metal particles. To prepare COOH-PDMS-COOH, acrylic acid was functionalized on DMS-H21 through hydrosilyation reaction. Then, 0.5 g of COOH-PDMS-COOH was dissolved in 50 mL of toluene, followed by addition of EGaln (~44 vol %, 5 g). The mixture was conducted by probe ultrasonic at 300 W for 60 min. After the ultrasonic process, a greyish colloidal suspension was obtained. 0.5 g of $NH_2$-PDMS-$NH_2$ was added into the suspension and stirred for 4 h at 403 K. The average particle size was about 260 nm, which was characterized by DLS.

The elastomer was prepared by crosslinking the prepared colloidal particles. The crosslinker was prepared by following the protocol to prepare COOH-PDMS-COOH above except the hydride terminated PDMS was replaced with PMHS. The crosslinker was added into the suspension prepared above, followed by stirring for 10 min. Using rotary evaporator, the solvent (toluene) was mostly removed, and the viscous product was casted in a customized mold. The casted product was dried for 24 h at ambient condition, and further curing at 403 K was conducted to give a soft and free-standing composite, SMEE.

Results and Discussion

When the bulk EGaln was split into colloidal particles using the ultrasonic process, a new oxide layer on the surface of the liquid metal was formed. During the oxide layer formation, the carboxylic acid-terminated polymer can be modified on the colloidal EGaln particles, and the surface-modified EGaln particle can be dispersed in organic solvents such as toluene. In this stage, the amine or hydroxyl group-terminated polymer can be other candidates for surface modification. The polymer, which was modified on the surface of the colloidal EGaln particles, serves not only as the surfactant but also a part of the polymer matrix. After adding the crosslinker in the suspension and evaporating the solvent, the surface-modified EGaln particles can be closed-packed, and the polymer on the surface of colloidal EGaln particles is crosslinking. Thus, >20 vol % of colloidal EGaln particles can be obtained. Despite the high-volume loading of colloidal EGaln particles in the composite, a soft and free-standing composite was obtained.

Example 3. Morphology and Mechanical Properties of SMEE

The morphology and mechanical properties of the SMEE prepared in Example 2 were surveyed.

Mechanical Test

The mechanical properties were obtained by the mechanical test MTS C42, and the sample was prepared into ASTM D638 type.

Results and Discussion

Figure 2:
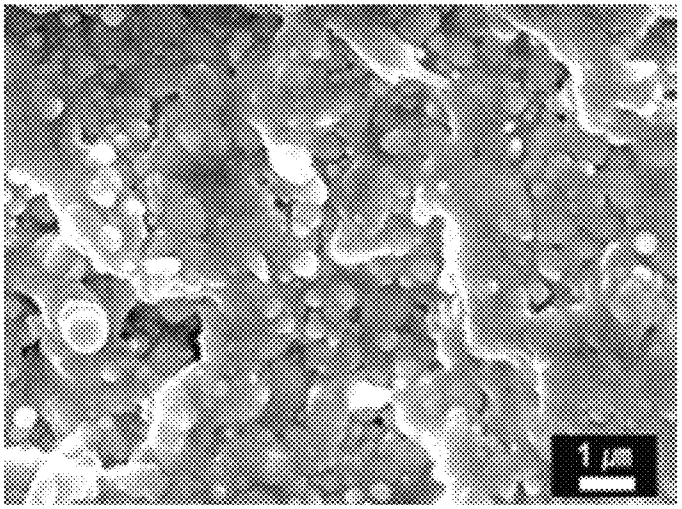
FIG. 2 depicts the scanning electron microscopy (SEM) image of 44 vol % SMEE.
Figure 3:
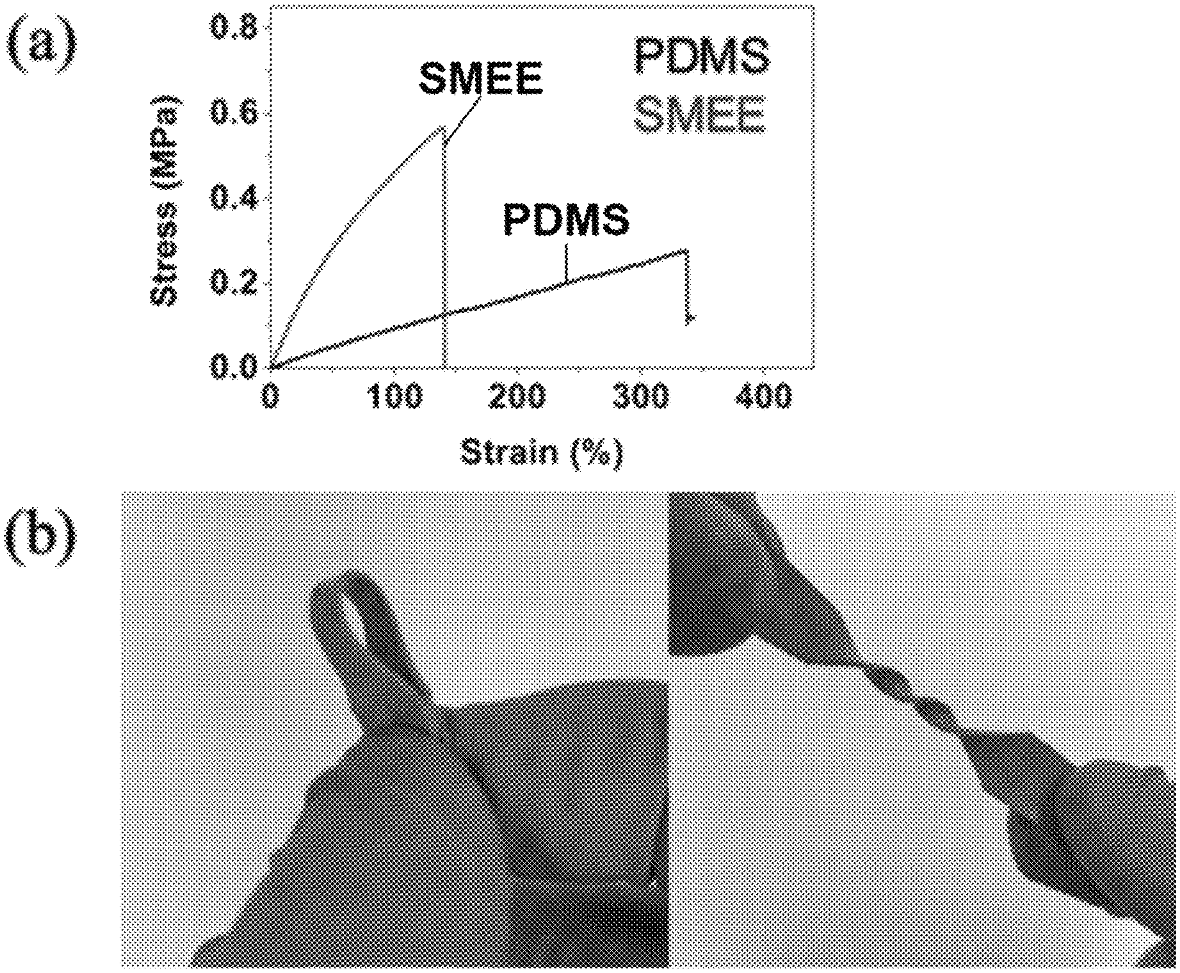
FIG. 3 depicts (a) strain-stress curve of pure polydimethylsiloxane (PDMS) and 44 vol % SMEE; and (b) photograph of deformable SMEE (left: bending, right: twist).

According to the Young-Laplace equation, an externally applied higher pressure is required to deform the smaller size of liquid particle (H. Liu & G. Cao, *Sci. Rep.* 2016, 6, 23936). As illustrated in FIG. 2, the spherical shape of colloidal EGaln particles with close-packing was observed. The strain-stress curve is illustrated in FIG. 3(*a*). The pure PDMS (COOH-PDMS-COOH/$NH_2$-PDMS-$NH_2$/PM (COOH)S) which was prepared in Example 1 without EGaln, showed 337% of break at elongation, and 1.16 kPa of elastic modulus, whereas the 44 vol % SMEE showed 140% of break at elongation, and 6.91 kPa of elastic modulus. Even though the elastic modulus of the 44 vol % SMEE was higher than that of the PDMS, the 44 vol % SMEE showed good deformability as shown in FIG. 3(*b*). Due to the colloidal EGaln particles (~$10^2$ nm) in the polymer matrix, the deformation of colloidal EGaln particles is limited under mechanical force, whereas the larger size of EGaln particles (~$10^1$ μm) is deformed readily under mechanical force (M. D. Bartlett et al., *Proc. Natl. Acad. Sci. U.S.A.* 2017, 114, 2143).

Therefore, employing surface modification on colloidal liquid metal particles, a high-volume loaded colloidal liquid metal particles/polymer composite was successfully fabricated without sacrificing flexibility.

Example 4. Thermal Conductivity of SMEE

Since the surface-modified EGaln particles are closed-packed in the polymer matrix, SMEE prepared in Example 2 can be thermally conductive. The thermal conductivity of the elastomer was characterized by transient hotwire method.

Transient Hotwire Method

In order to obtain the directional thermal conductivity, a Pt wire (d=50 μm) was embedded in the EGaln and PDMS composite (EGaln particles (~10[1] μm)/PDMS composite (larger size EGaln elastomer) or SMEE) before curing. The Pt wire was orientated parallel or perpendicular to the direction of the stretching.

In the case of thermal conductivity, transient hotwire method was employed. Briefly, Pt wire (Φ=50 μm, 99.99%) was used for generating heat, and determining temperature difference (ΔT). Before the curing elastomer, the Pt wire was located in the mold as a function of direction, and the sample was poured and cured. The ΔT of heat source (Pt wire) as a function of time is defined by $$\Delta T(t) = \frac{q}{4\pi\kappa}\ln\frac{4t\alpha}{r^2C} = \frac{I^2R_0}{4\pi\kappa L}\ln\frac{4t\alpha}{r^2C} \quad (1)$$

Where q, K, t, a, r, C, I, $R_0$, and L are heat flow per unit length of Pt wire, thermal conductivity of sample, time, thermal diffusivity, radius of wire, Euler's constant, input current, initial resistance of wire, and length of wire, respectively.

From equation (1), the thermal conductivity was calculated by $$\kappa = \frac{q}{4\pi}/\frac{d\Delta T(t)}{d(\ln(t))} \quad (2)$$

In order to obtain dΔT(t)/d(ln(t)), firstly, the voltage change (ΔV(t)) of Pt wire was measured by Data acquisition/multimeter system (DAQ6510, Keithley), and the constant current was applied by source meter (Keithley2400), as a function of time. Exploiting Ohm's law, the ΔV(t) was converted into ΔR(t), which is ΔR(t)=ΔV(t)/I. And, using temperature coefficient of resistance (β) of Pt, ΔT(t) was calculated by $$\Delta T = [(R(t)/R_0) - 1]/\beta \quad (3)$$

Where $R_0$ is initial resistance.

After obtaining the ΔT as a function of t, the linear fitting was conducted for dΔT(t)/d(ln(t)).

Electrical Insulation Test

To evaluate electrical insulation, the relative permittivity, dielectric loss tangent and resistivity of the elastomer were examined by the LCR meter (4263B, Agilent).

Results and Discussion

Figure 4:
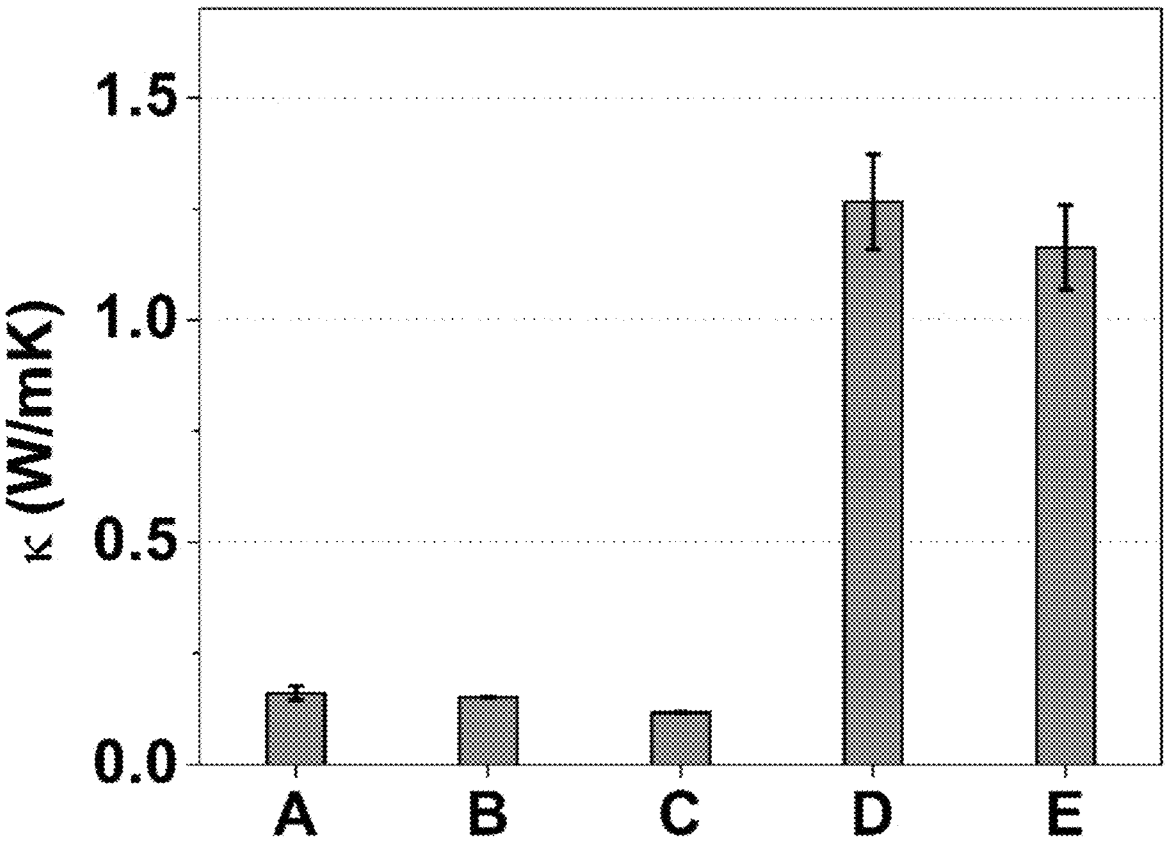
FIG. 4 depicts the thermal conductivities of (a) Sylgard184 (commercial PDMS); (b) Ecoflex00-30 (commercial PDMS); (c) PDMS; (d) 44 vol % larger size EGaln ($\sim10^1$ μm)/PDMS; and (e) 44 vol % SMEE.
Figure 5:
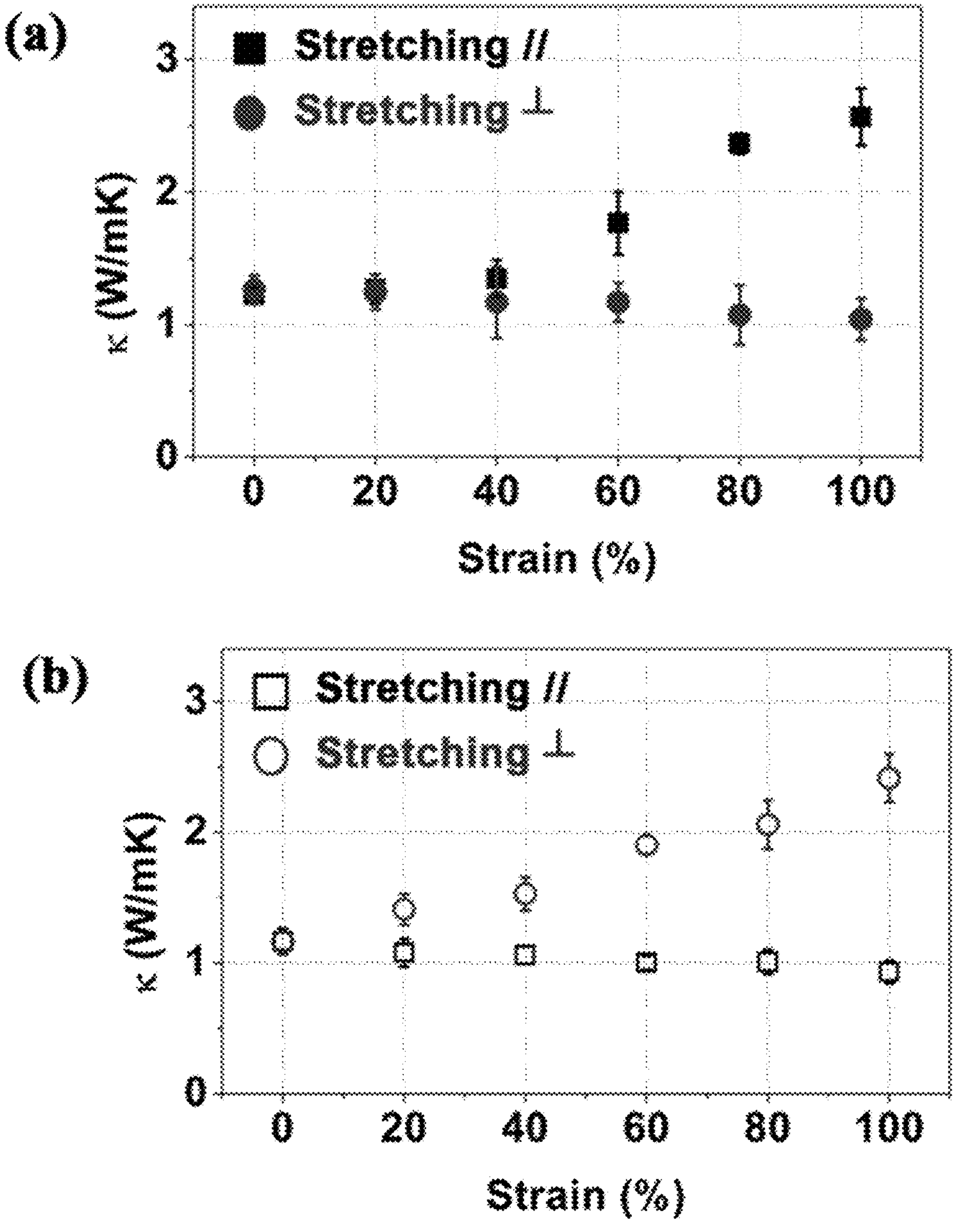
FIG. 5 depicts (a) thermal conductivity of 44 vol % larger size EGaln ($\sim10^1$ μm)/PDMS as a function of strain; and (b) thermal conductivity of 44 vol % SMEE as a function of stretching.

The thermal conductivities of pure commercial PDMSs (Sylgard184 and Ecoflex00-30), COOH-PDMS-COOH/$NH_2$-PDMS-$NH_2$/PM(COOH)S, larger size EGaln elastomer (~10[1] μm), and SMEE are shown in FIG. 4. As illustrated in FIG. 5, the thermal conductivity of SMEE with perpendicular direction of stretching was enhanced depending on the stretching, whereas that with parallel direction of stretching was reduced slightly. When we examined the thermal conductivity of the larger size EGaln particles (~10[1] μm)/PDMS composite in a similar manner, the opposite tendency was shown. Accordingly, SMEE demonstrated unique thermal transport properties under mechanical force. Owing to the limited shape deformation of the colloidal liquid metal particles in the polymer matrix, the thermal conductivity of SMEE with compression direction was improved due to enhanced contact between the colloidal liquid metal particles.

Since the colloidal EGaln particles are protected and well-encapsulated in the polymer matrix, SMEE is electrically insulating. Even though external mechanical force such as cut, local pressure, and cyclic loading, was applied, the electrical insulation of SMEE was sustained without coalescence of the colloidal EGaln particles. For example, the relative permittivity of SMEE was changed from 17.1 to 13.8 as a function of stretching from 0 to 100%. In the same stretching range, the dielectric loss tangent of SMEE was below 0.002 and the resistivity of SMEE was maintained at ~8 GΩcm. These results indicate that there was no coalescence of EGaln nanoparticle, which provides parasitic electrical conductivity. Therefore, SMEE is electrically insulating and thermally conductive.

Example 5. Fabrication of Thermoelectric Device with SMEE Thermal Interface Layer In the case of the thermal interface layer, it is essential to adopt a thermally conductive but electrically insulating material. Employing the SMEE prepared in Example 2, a wearable and deformable thermoelectric device was realized. The thermoelectric device with SMEE thermal interface layer was fabricated such that it had a similar structure to the commercial Peltier device. The commercial n- and p-type $Bi_2Te_3$ based thermoelectric legs, which are components of the commercial Peltier device (CP4555e5H, CUI Devices), were used. SMEE (10 mm×10 mm×1 mm (length×width×thickness)) was prepared according to Example 2, and the Cu electrodes were attached for the series connection of the n- and p-type thermoelectric legs. An Ag paste was employed for connecting the thermoelectric legs with the Cu electrodes.

In order to compare performance, pure PDMS, larger size EGaln elastomer, and SMEE elastomer were also prepared as thermal interface layer by following the protocol above.

Example 6. Thermoelectric Performance of the Device with SMEE Thermal Interface Layer The thermoelectric performance of the devices prepared in Example 5 was characterized.

Thermoelectric Performance

In the case of energy harvesting performance (Seebeck effect), the device prepared in Example 5 was sandwiched between the commercial Peltier devices, and the current in the commercial Peltier devices was applied. Depending on the current, ΔT=4.7, 8.8, and 12.7 K were generated between the hot side and cold side of the device prepared in Example 5.

Results and Discussion

During the use of a thermoelectric device, the mechanical force with heat flux such as stretching, touching and contact with object, is applied frequently. The SMEE prepared in Example 2 provides effective heat transport between thermal stimuli and n-p junction under mechanical force since the composite is flexible and thermally conductive, and the heat flux can be delivered effectively at the hot side and the cold side of the device.

Figure 6:
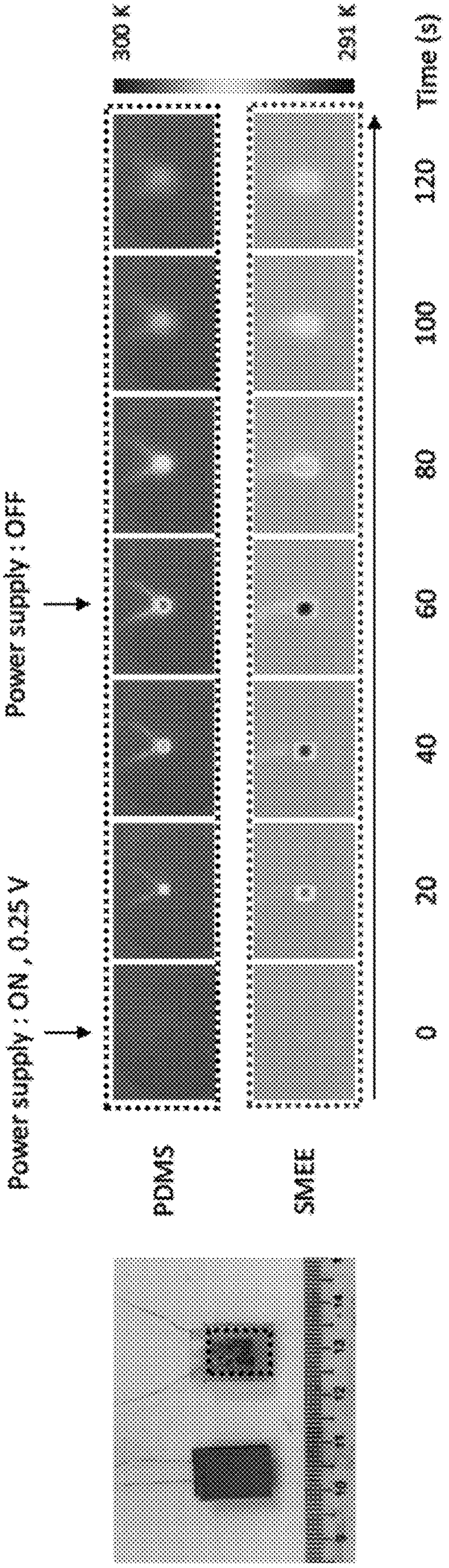
FIG. 6 depicts the time dependent infra-red (IR) images of the thermoelectric device with PDMS (top row) and SMEE (bottom row) thermal interface.

In the case of cooling performance (Peltier effect), the thermoelectric devices with pure PDMS and SMEE were compared. When the electrical voltage was applied in the device, effective heat dissipation performance was seen in the device with SMEE thermal interface layer whereas with pure PDMS thermal interface layer, it was observed that heat accumulation occurred near the electrode part (FIG. 6).

Figure 7:
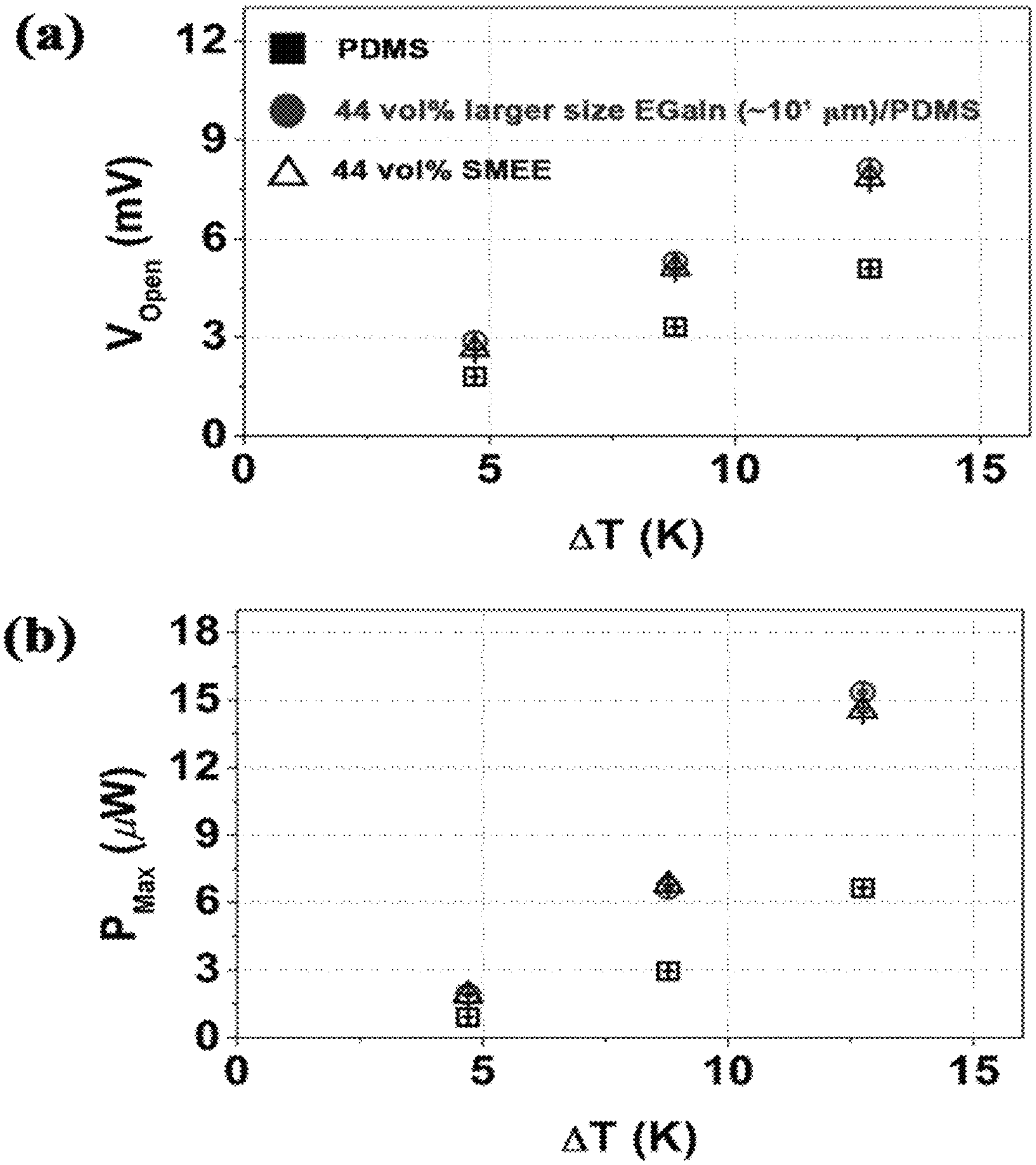
FIG. 7 depicts (a) $V_{Open}$ of thermoelectric device with PDMS (square), 44 vol % larger size EGaln ($\sim10^1$ μm)/PDMS (circle), and 44 vol % SMEE (triangle) as a function of $\Delta T$; and (b) $P_{Max}$ of thermoelectric device with PDMS (square), 44 vol % larger size EGaln ($\sim10^1$ μm)/PDMS (circle), and 44 vol % SMEE (triangle) as a function of $\Delta T$.

Typically, the open circuit voltage and power output of larger size EGaln elastomer and SMEE elastomer were higher than that of pure PDMS at the constant temperature gradient between hot side and cold side, which demonstrates that the EGaln containing elastomer has higher thermal transport (FIG. 7). In addition, the energy harvesting performance of the devices at $\Delta T=4.7$ K was measured as a function of pressure between hot side and cold side. The normalized open circuit voltage and power output of the device with SMEE thermal interface layer were improved with increasing pressure, whereas the normalized open circuit voltage and power output of the device with pure PDMS thermal interface layer and the device with larger size EGaln elastomer thermal interface layer were reduced slightly (FIG. 8).

Thus, SMEE is critically important for the thermal interface role in the thermoelectric device described above.

The invention claimed is:

1. A composite material comprising a crosslinked polymeric matrix, the crosslinked polymeric matrix comprising:

a polymeric material comprising a plurality of carboxylic acid functional groups; and a plurality of liquid metal particles having a surface functionalized with a plurality of amino and/or hydroxyl functional groups, wherein the plurality of liquid metal particles and the polymeric material are covalently bonded together by a plurality of amide and/or ester bonds formed from the plurality of carboxylic acid functional groups and the plurality of amino and/or hydroxyl functional groups.

2. The composite material according to claim 1, wherein the polymeric material is a polyalkylcarboxylic acid siloxane.

3. The composite material according to claim 2, wherein the polyalkylcarboxylic acid siloxane has a repeating unit according to formula I:

I

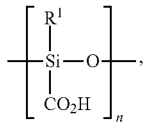

where $R^1$ is a $C_1$ to $C_6$ alkyl group that is unbranched or branched.

4. The composite material according to claim 1, wherein the polymeric material has a number average molecular weight of from 700 to 5000 g/mol.

5. The composite material according to claim 1, wherein the plurality of liquid metal particles have a surface functionalized by a block copolymer moiety formed from formula II and/or formula III:

II

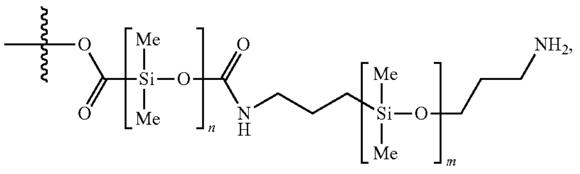

III

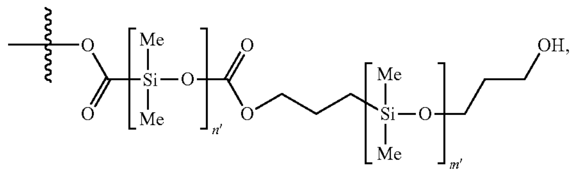

where n, n', m and m' refer to the repeating units of the block copolymer moiety; and the wavy line refers to the point of attachment to the surface of the liquid metal particles to which the block copolymer moiety is attached.

6. The composite material according to claim 5, wherein the number average molecular weight of the block copolymer moiety is from 5,000 to 20,000 g/mol.

7. The composite material according to claim 1, wherein the plurality of liquid metal particles having a surface functionalized with a plurality of amino and/or hydroxyl functional groups have an average particle size of from 50 nm to 50 μm.

8. The composite material according to claim 1, wherein the liquid metal in the plurality of liquid metal particles having a surface functionalized with a plurality of amino functional groups is selected from one or more of the group consisting of EGaIn, EGaInSn, EGaInSnZn, ECsIn, ECsInSn, ECsInZn.

9. The composite material according to claim 1, wherein the plurality of liquid metal particles form from greater than 20 to 50 vol % of the composite material's volume.

10. The composite material according to claim 1, wherein the plurality of liquid metal particles are provided having a close packed arrangement within the composite material.

11. The composite material according to claim 1, wherein the composite material has a thermal conductivity of from 1.0 to 1.5 κ(W/mK).

12. The composite material according to claim 1, wherein, when:

(i) the plurality of liquid metal particles having a surface functionalized with a plurality of amino and/or hydroxyl functional groups have an average particle size of from 50 nm to 1 μm; and (ii) the composite material is formed as a cuboidal film with a length and a width, where the width is smaller in dimension than the length, the composite material has:

(ai) a thermal conductivity under a strain perpendicular to the length of the cuboidal film that is greater than a thermal conductivity of the same cuboidal film when under no strain; and/or (aii) a thermal conductivity under a strain parallel to the length of the cuboidal film that is less than or equal to a thermal conductivity of the same cuboidal film when under no strain.

13. The composite material according to claim 1, wherein, when:

(ia) the plurality of liquid metal particles having a surface functionalized with a plurality of amino and/or hydroxyl functional groups have an average particle size of from greater than 1 to 50 μm; and (iia) the composite material is formed as a cuboidal film with a length and a width, where the width is smaller in dimension than the length, the composite material has:

(bi) a thermal conductivity under a strain parallel to the length of the cuboidal film that is greater than a thermal conductivity of the same cuboidal film when under no strain; and/or (bii) a thermal conductivity under a strain perpendicular to the length of the cuboidal film that is less than or equal to a thermal conductivity of the same cuboidal film when under no strain.

14. The composite material according to claim 1, wherein the plurality of liquid metal particles having a surface functionalized with a plurality of amino and/or hydroxyl functional groups have a surface functionalized with a plurality of amino functional groups.

15. A thermal interface layer comprising a composite material according to claim 1 and n- and p-type thermoelectric legs.

16. A deformable thermoelectric device comprising a composite material according to claim 1.

17. The deformable thermoelectric device according to claim 16, where the thermoelectric device comprises a thermal interface layer comprising the composite material according to claim 1 and n- and p-type thermoelectric legs.

18. The deformable thermoelectric device according to claim 16, wherein when the deformable thermoelectric device has a first surface and a second surface and the plurality of liquid metal particles having a surface functionalized with a plurality of amino and/or hydroxyl functional groups have an average particle size of from 50 nm to 10 μm, then when a difference in temperature exists between the first surface and the second surface of the deformable thermoelectric device, then a normalized open circuit voltage of the thermoelectric device will increase with an increase in pressure.

19. The deformable thermoelectric device according to claim 16, wherein the deformable thermoelectric device is a wearable deformable thermoelectric device.

20. The deformable thermoelectric device according to claim 16, wherein the deformable thermoelectric device forms part of one or more of a power device in an antenna, and a deformable device that requires power.

* * * * *